(12) United States Patent
Spiel

(10) Patent No.: US 9,674,985 B1
(45) Date of Patent: Jun. 6, 2017

(54) DUAL PURPOSE WIRELESS DEVICE PACKAGING

(71) Applicant: Cisco Technology, Inc., San Jose, CA (US)

(72) Inventor: Seth Brandon Spiel, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 21 days.

(21) Appl. No.: 14/951,288

(22) Filed: Nov. 24, 2015

(51) Int. Cl.
*H05K 7/20* (2006.01)
*H05K 5/02* (2006.01)

(52) U.S. Cl.
CPC ....... *H05K 7/20436* (2013.01); *H05K 5/0247* (2013.01)

(58) Field of Classification Search
CPC .................. H05K 7/20436; H05K 5/0247
USPC .................................. 361/688–723
See application file for complete search history.

(56) References Cited

U.S. PATENT DOCUMENTS

| | | | |
|---|---|---|---|
| 6,864,573 B2 | 3/2005 | Robertson et al. | |
| 7,990,726 B2 | 8/2011 | Izuhara et al. | |
| 8,422,232 B2 * | 4/2013 | Kwak | H01Q 1/02 343/872 |
| 8,681,501 B2 * | 3/2014 | Govindasamy | G06F 1/203 174/16.3 |
| 2004/0113712 A1 * | 6/2004 | Kim | H01P 5/02 333/12 |
| 2013/0222201 A1 * | 8/2013 | Ma | H04W 84/042 343/834 |
| 2014/0104786 A1 * | 4/2014 | Clayton | H05K 1/147 361/679.54 |
| 2014/0268578 A1 * | 9/2014 | Dolci | H05K 9/0049 361/719 |

* cited by examiner

*Primary Examiner* — Anthony Haughton
*Assistant Examiner* — Yahya Ahmad
(74) *Attorney, Agent, or Firm* — Squire Patton Boggs (US) LLP

(57) ABSTRACT

In one embodiment, an apparatus includes: an antenna mount provided for an antenna; a first portion of an electrically conductive heat coupler provided for the antenna mount, wherein the first portion of the electrically conductive heat coupler reflects electromagnetic radiation associated with the antenna; and a second portion of the electrically conductive heat coupler electrically coupled to the first portion, where the second portion is shaped for arrangement in association with the placement of one or more electrical components on a substrate in order to draw heat away from at least one of the one or more electrical components and dissipate the heat over a combined surface area of the first and second portions of the electrically conductive heat coupler.

20 Claims, 14 Drawing Sheets

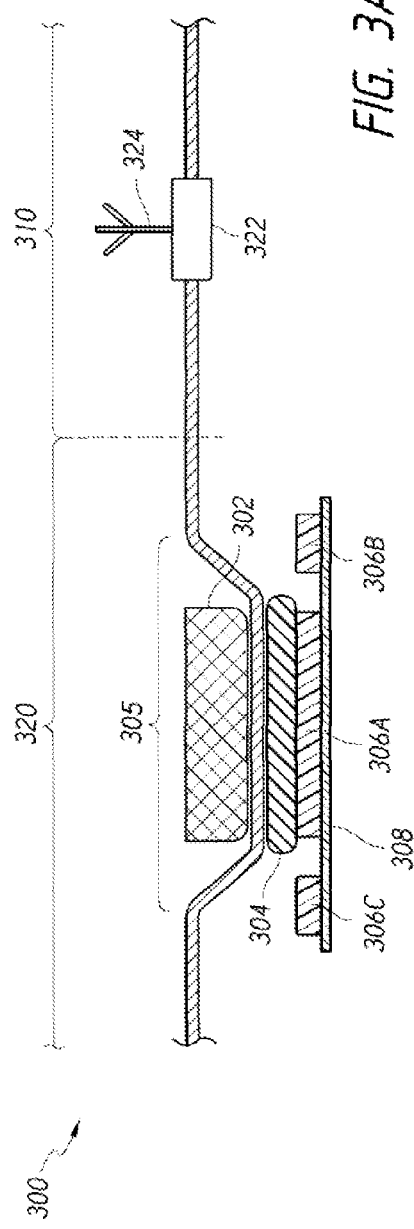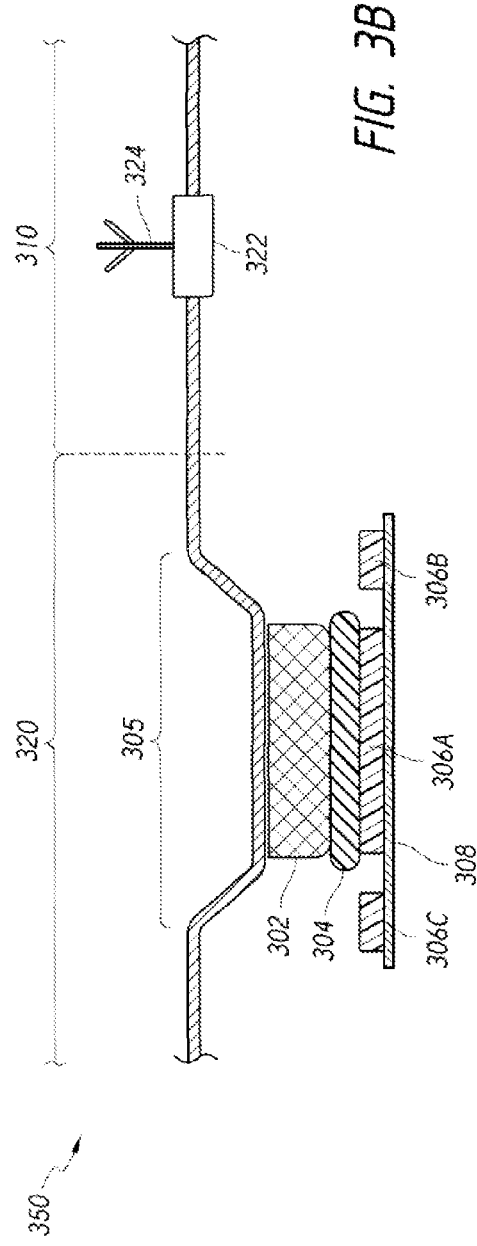

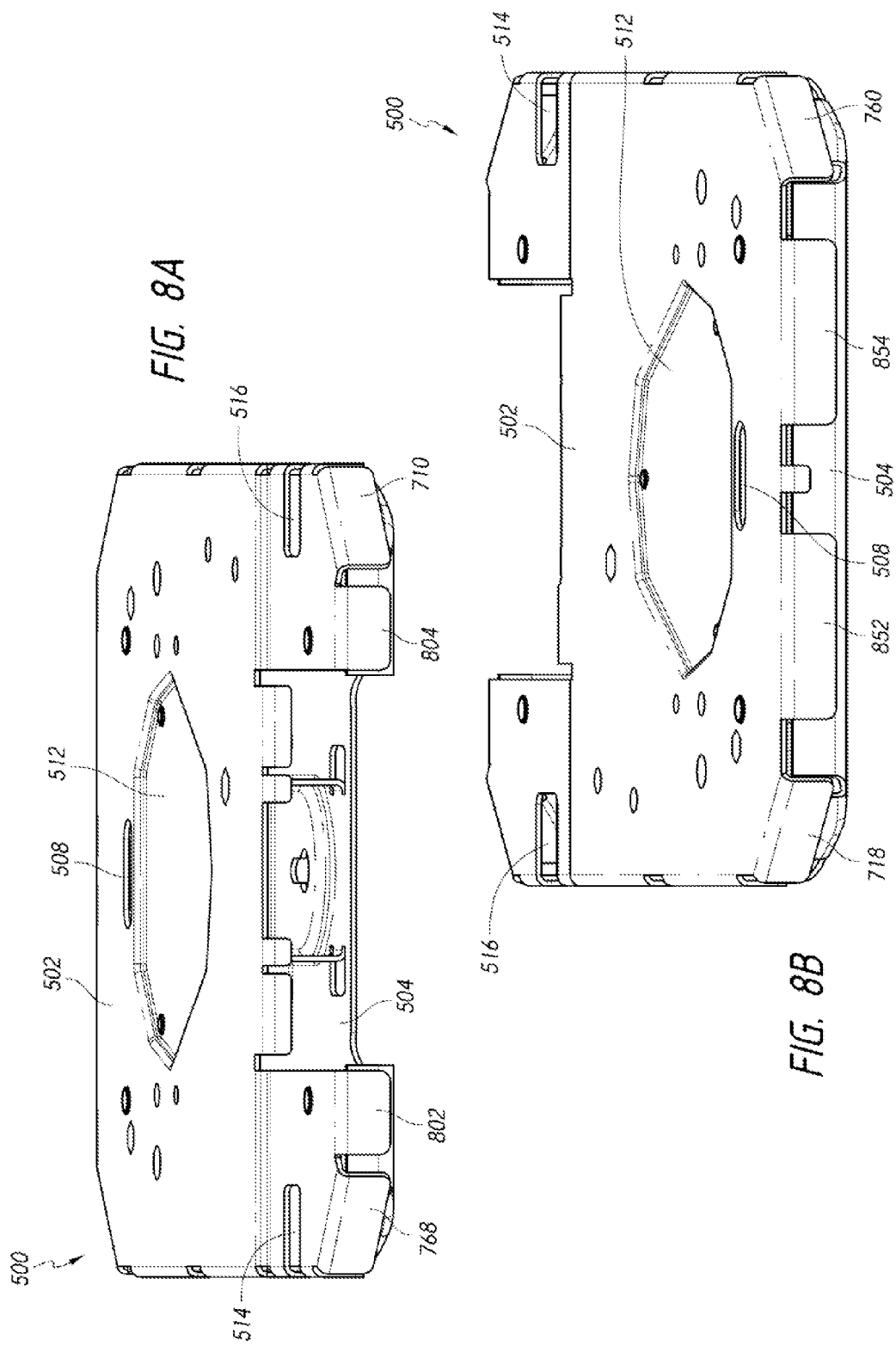

DUAL PURPOSE WIRELESS DEVICE PACKAGING

TECHNICAL FIELD

The present disclosure relates generally to wireless devices, and in particular, to a dual purpose packaging provided to support both thermal management and antenna functionality.

BACKGROUND

The ongoing development of data networks often involves enabling greater connectivity by expanding the area covered by a network and/or improving the robustness of accessible coverage within a particular area. Wireless access points (APs) simplify the deployment of network infrastructure equipment and enable rapid installation and/or expansion of a network within a coverage area. As a result, various data networks, from local area networks (LANs) to wide area networks (WANs), now often include a number of wireless APs. Wireless APs also facilitate client device mobility by providing relatively seamless access to a network throughout a coverage area.

In order to satisfy demand, wireless APs include increasingly complicated and power hungry hardware in order to support wireless connectivity. For example, wireless APs typically include more than one radio frequency (RF) radio in order to both provide sufficient coverage and accommodate various networking protocols (e.g., IEEE 802.11g, IEEE 802.11n, IEEE 802.11ac, IEEE 802.15, BLUETOOTH, ZigBee, and the like).

The growing complexity of wireless access points often results in greater power consumption and thus greater heat dissipation by the constituent electronics. Additionally, there is typically a preference for wireless access points that are relatively small and that have a discreet form factor. Greater heat dissipation, when combined with the small form factor, further exacerbates the possibility of damaging components within a wireless AP and degrading the performance of the wireless AP.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

FIG. 3A is a side view of an example dual purpose packaging in accordance with some implementations.

FIG. 3B is a side view of another example dual purpose packaging in accordance with some implementations.

FIG. 8A is a simplified perspective view taken from a first end of the dual purpose packaging in FIG. 5A in accordance with some implementations.

FIG. 8B is a simplified perspective view taken from a second end of the dual purpose packaging in FIG. 5A in accordance with some implementations.

Figure 1:
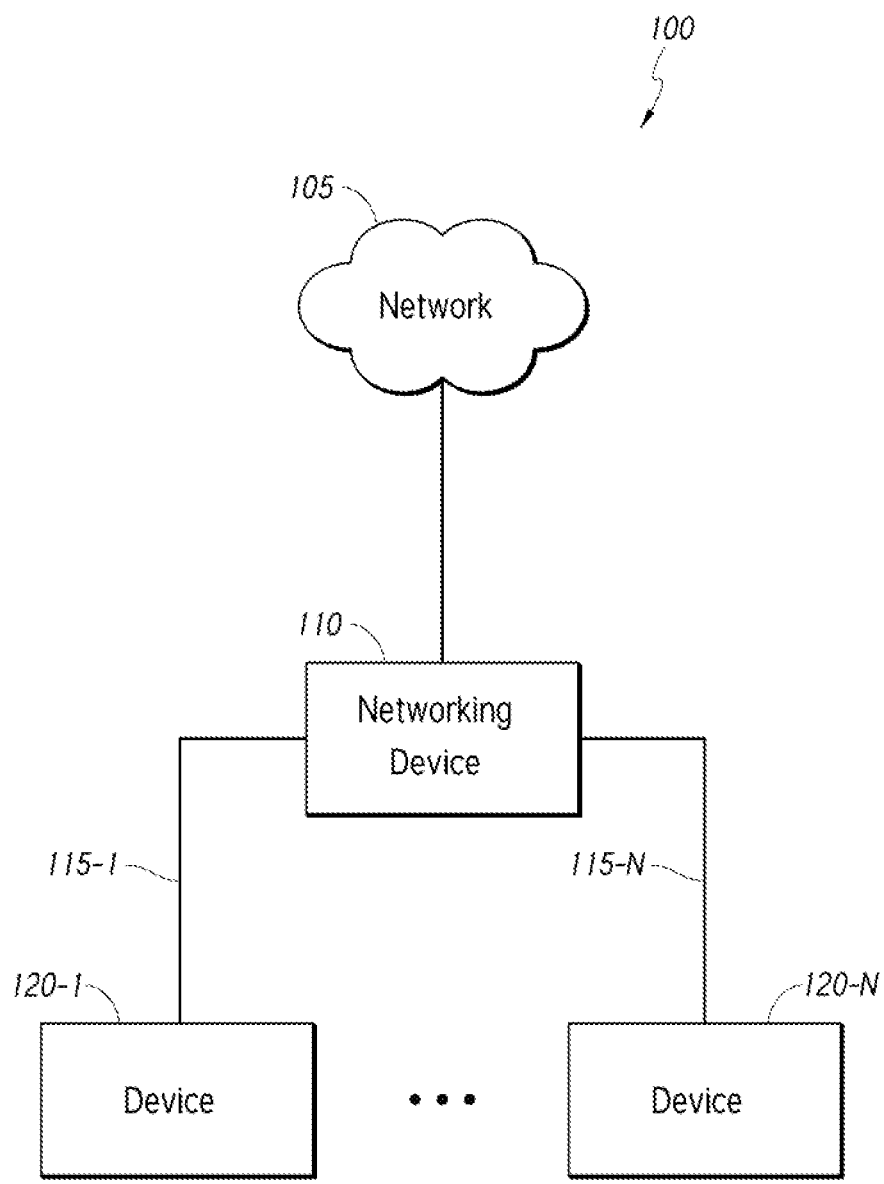
FIG. 1 is a block diagram of a data network in accordance with some implementations.

In accordance with common practice various features shown in the drawings may not be drawn to scale, as the dimensions of various features may be arbitrarily expanded or reduced for clarity. Moreover, the drawings may not depict all of the aspects and/or variants of a given system, method or apparatus admitted by the specification. Finally, like reference numerals are used to denote like features throughout the figures.

DESCRIPTION OF EXAMPLE EMBODIMENTS

Numerous details are described herein in order to provide a thorough understanding of the illustrative implementations shown in the accompanying drawings. However, the accompanying drawings merely show some example aspects of the present disclosure and are therefore not to be considered limiting. Those of ordinary skill in the art will appreciate from the present disclosure that other effective aspects and/or variants do not include all of the specific details of the example implementations described herein. While pertinent features are shown and described, those of ordinary skill in the art will appreciate from the present disclosure that various other features, including well-known systems, methods, components, devices, and circuits, have not been illustrated or described in exhaustive detail for the sake of brevity and so as not to obscure more pertinent aspects of the example implementations disclosed herein.

Overview

Various implementations disclosed herein include apparatuses, devices, and systems for drawing heat away from at least one electrical component of a networking device and dissipating it over a surface area, where the surface area also reflects electromagnetic (EM) radiation associated with an antenna mounted on the surface area. For example, in some implementations, an apparatus includes: an antenna mount provided for an antenna; a first portion of an electrically conductive heat coupler provided for the antenna mount, wherein the first portion of the electrically conductive heat coupler reflects EM radiation associated with the antenna; and a second portion of the electrically conductive heat coupler electrically coupled to the first portion, where the second portion is shaped for arrangement in association with the placement of one or more electrical components on a substrate in order to draw heat away from at least one of the one or more electrical components and dissipate the heat over a combined surface area of the first and second portions of the electrically conductive heat coupler.

Example Embodiments

Typical networking devices (e.g., wireless access points (APs), switches or network routers) may include several radio frequency (RF) radio transmitters (i.e., antennae) and other electrical components to support a diverse set of features. The increasing complexity of network devices leads to an increase in power consumption, which, in turn, results in the generation of a troublesome amount of thermal energy within the networking device. To abate the overheating of electrical components within the networking device, the packaging of the networking device (e.g., the clamshell structure shown in FIG. 5A) is configured for arrangement in association with the electrical components that produce the most heat (e.g., a power supply or processor). The packaging functions as an electrically conductive heat coupler that draws heat away from electrical components and dissipates the heat over the surface area of the packaging. In some implementations, the packaging of the networking device further includes an antenna mount provided for an antenna and at least a portion of the surface area of the electrically conductive heat coupler reflects electromagnetic (EM) radiation associated with the antenna. As such, the packaging of the networking device functions as an antenna reflector in addition to an electrically conductive heat coupler/dissipater.

FIG. 1 is a block diagram of a data network 100 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, as a non-limiting example, the data network 100 includes a networking device 110 (e.g., wireless access point (AP), a switch, a network router, or the like) that provides a number of devices 120-1, . . . , 120-N access to a network 105. The network 105 may include any public or private LAN (local area network) and/or WAN (wide area network), such as an intranet, an extranet, a virtual private network, and/or portions of the Internet.

In some implementations, one or more of the devices 120-1, . . . , 120-N are client devices including hardware and software for performing one or more functions. Example client devices include, without limitation, desktop computers, laptops, video game systems, tablets, mobile phones, media playback systems, wearable devices, IP (Internet protocol) cameras, VoIP (Voice-over-IP) phones, intercoms and public address systems, clocks, sensors, access controllers (e.g., keycard readers), lighting controllers, security systems, building management systems, or the like. In some implementations, one or more of the devices 120-1, . . . , 120-N may be virtual devices that consume power through the use of underlying hardware.

The networking device 110 (which may also be referred to as an AP, a switch, or a network router) receives and transmits data between the network 105 and the devices 120-1, . . . , 120-N. In some implementations, the networking device 110 manages the flow of data of the data network 100 by transmitting messages (e.g., data packets) received from the network 105 to the devices 120-1, . . . , 120-N for which the messages are intended. The networking device 110 is communicatively coupled to each of the devices 120-1, . . . , 120-N via respective transmission media 115, which may be wired or wireless. For example, in some implementations, the networking device 110 is coupled to at least one of the devices 120-1, . . . , 120-N via an Ethernet cable. For example, in other implementations, the networking device 110 is coupled to at least one of the devices 120-1, . . . , 120-N via a wireless networking specification such as IEEE 802.11a, IEEE 802.11b, IEEE 802.11g, IEEE 802.11n, IEEE 802.11ac, IEEE 802.11ad, IEEE 802.15, or the like.

Figure 2:
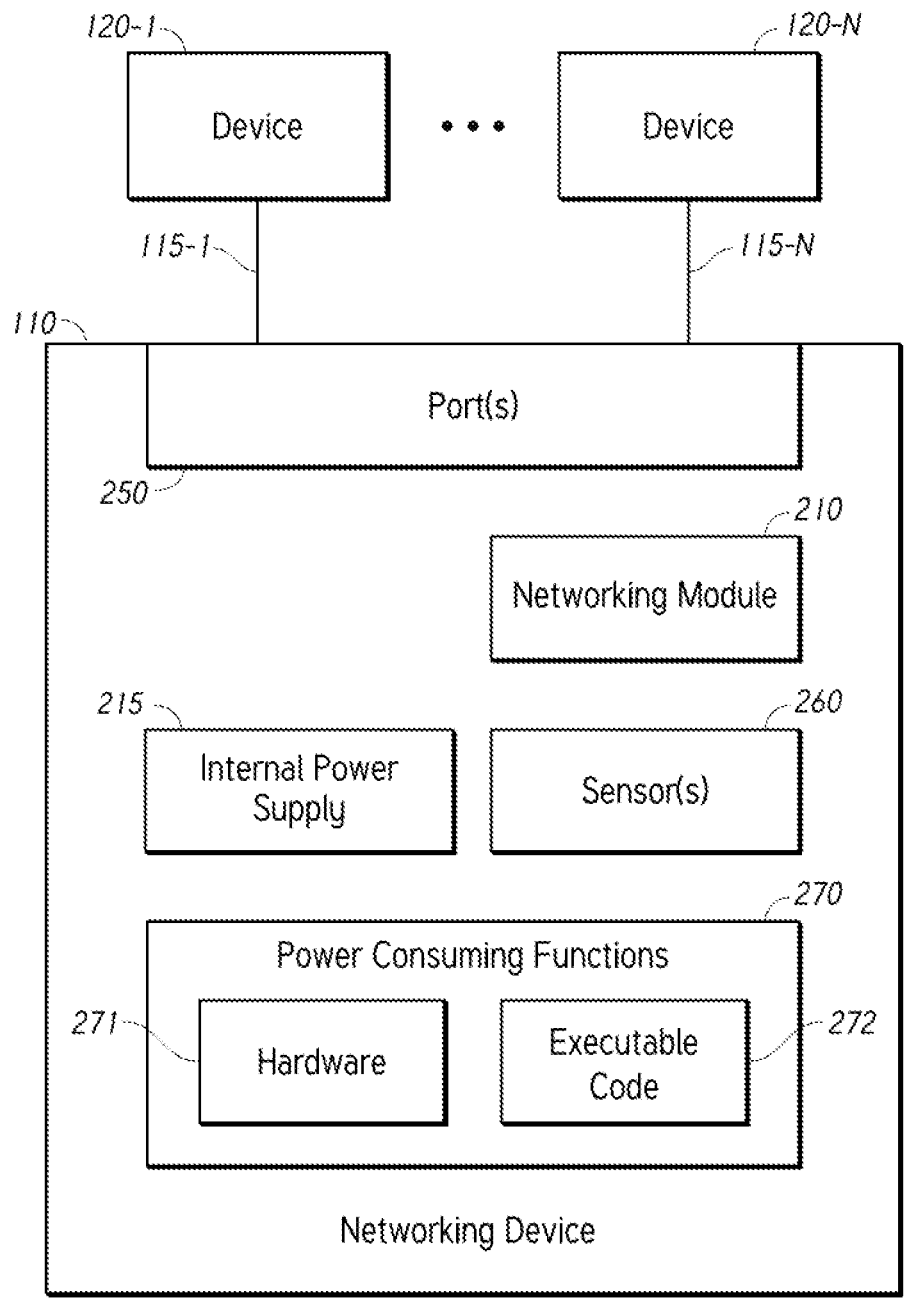
FIG. 2 is a block diagram of a networking device in accordance with some implementations.

FIG. 2 is a block diagram of the networking device 110 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, as a non-limiting example, the networking device 110 includes one or more ports 250 for coupling to the devices 120-1, . . . , 120-N via respective transmission media 115. The transmission media 115 may be a wired or wireless transmission medium. In one example, the transmission media 115 are Ethernet cables and the one or more ports 250 are Ethernet ports. In another example, the one or more ports 250 are universal serial bus (USB) ports or the like.

In some implementations, the networking device 110 includes a networking module 210 configured to route data to and/or from the devices 120-1, . . . , 120-N. Although the networking device 110 may receive power from an external source (e.g., an AC outlet, via a Power-over-Ethernet (PoE) standard from a switching hub, inductive means, or the like), it is to be appreciated that the networking device 110 may include an optional internal power supply 215 such as one or more batteries.

In some implementations, the networking device 110 also includes one or more sensors 260 such as a temperature sensor, a pressure sensor, a humidity sensor, a light sensor, an infrared sensor, and/or a position sensor such as an accelerometer, magnetometer, gyroscope, proximity sensor, and/or GPS (global positioning system) sensor. Further, although certain types of sensors 260 are illustrated in FIG. 2, it is to be appreciated that the networking device 110 may include other types of sensors 260 such as a camera, a chemical sensor, a microphone, and/or the like.

In some implementations, the networking device 110 enables one or more power consuming functions 270 (e.g., features of the networking device 110) according to various factors such as client demand, power available, and/or the like. The power consuming functions 270 may include hardware 271 and/or executable code 272. For example, in some implementations, the hardware 271 includes backup 2.4 GHz or 5.0 GHz radios, interference scanning, BLUETOOTH/BLUETOOTH Low Energy radios, or additional data ports (e.g., USB or Ethernet ports). In some implementations, the executable code 272 includes software for performing one or more functions such as security functionality or spectral analysis.

In some implementations, in order to enable a power consuming function 270 including hardware 271, the networking device 110 transmits a signal to the hardware 271 to activate it, transmits a signal to other hardware that enables power to activate the hardware 271, or the like. In some implementations, in order to enable a power consuming function 270 including executable code 272, the networking device 110 instructs a processor to execute the executable code 272.

Figure 5A:
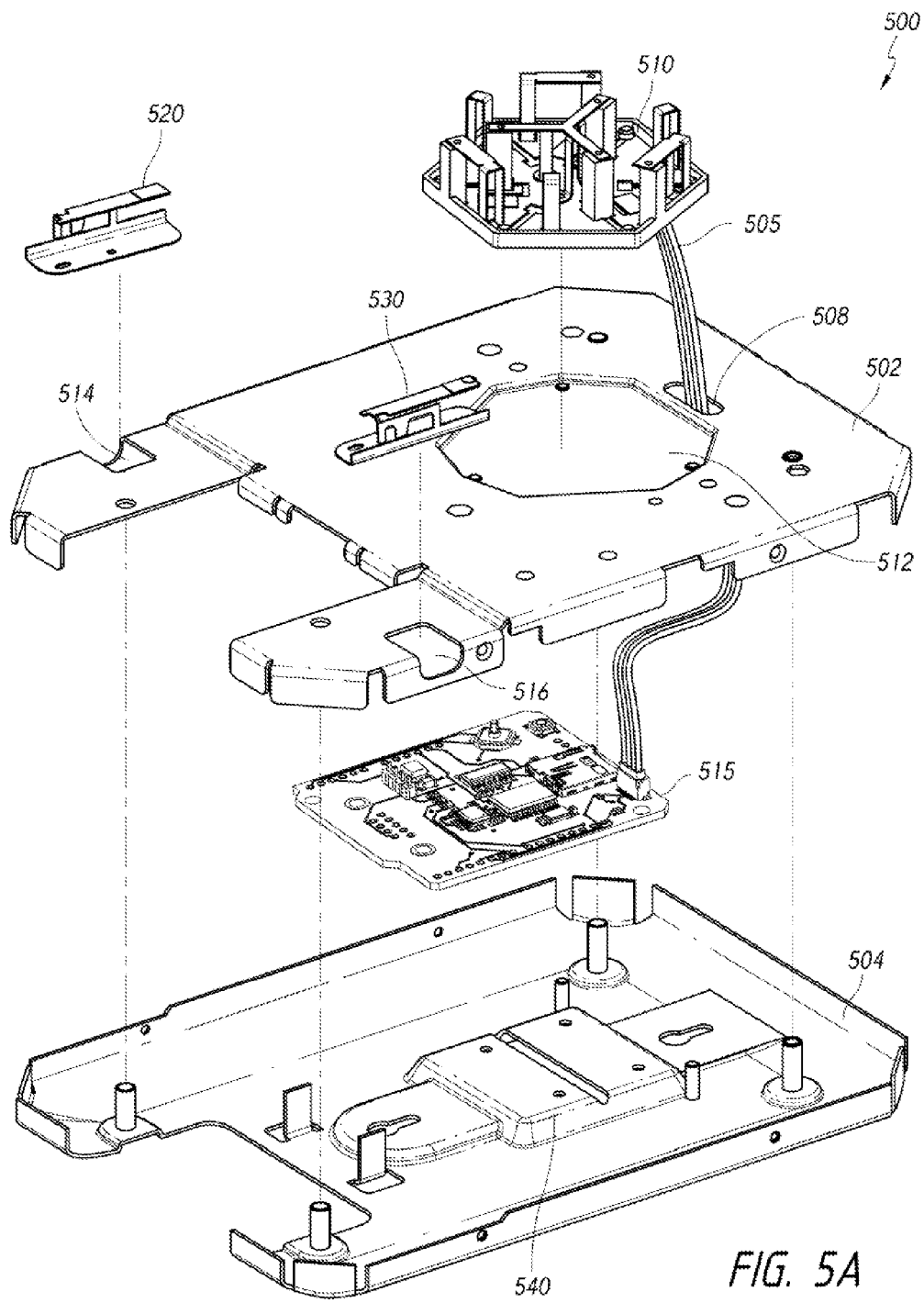
FIG. 5A is an exploded view of an example dual purpose packaging in accordance with some implementations.

FIG. 3A is a side view of an example dual purpose packaging 300 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, as a non-limiting example, the dual purpose packaging 300 for a networking device includes a first portion 310 having an antenna mount 322 provided for an antenna 324 and a second portion 320. As such, for example, the co-planar first and second portions 310, 320 of the dual purpose packaging 300 form a first section of a clamshell structure that encloses the substrate 308. With reference to FIG. 5A, for example, the first portion 310 and the second portion 320, which are co-planar, correspond to the top section 502.

In some implementations, the first portion 310 is configured to reflect electromagnetic (EM) radiation associated with the antenna 324. In some implementations, the second portion 320 is shaped or positioned for arrangement in association with the placement of a respective electrical component associated with the substrate 308 in order to draw heat away from at least the respective electrical component and dissipate the heat over a combined surface area of the dual purpose packaging 300 (e.g., the first portion 310 and the second portion 320). In some implementations, one or more conductive materials comprise the first portion 310 such as a metallic composite, aluminum, steel, copper, or the like. In some implementations, one or more conductive materials comprise the second portion 320 such as a metallic composite, aluminum, steel, copper, or the like. In some implementations, the first portion 310 is electrically coupled with the second portion 320 as shown in FIG. 3A. As such, the dual purpose packaging 300 functions as an electrically conductive heat coupler/dissipater and also as an EM radiation reflector.

Figure 6A:
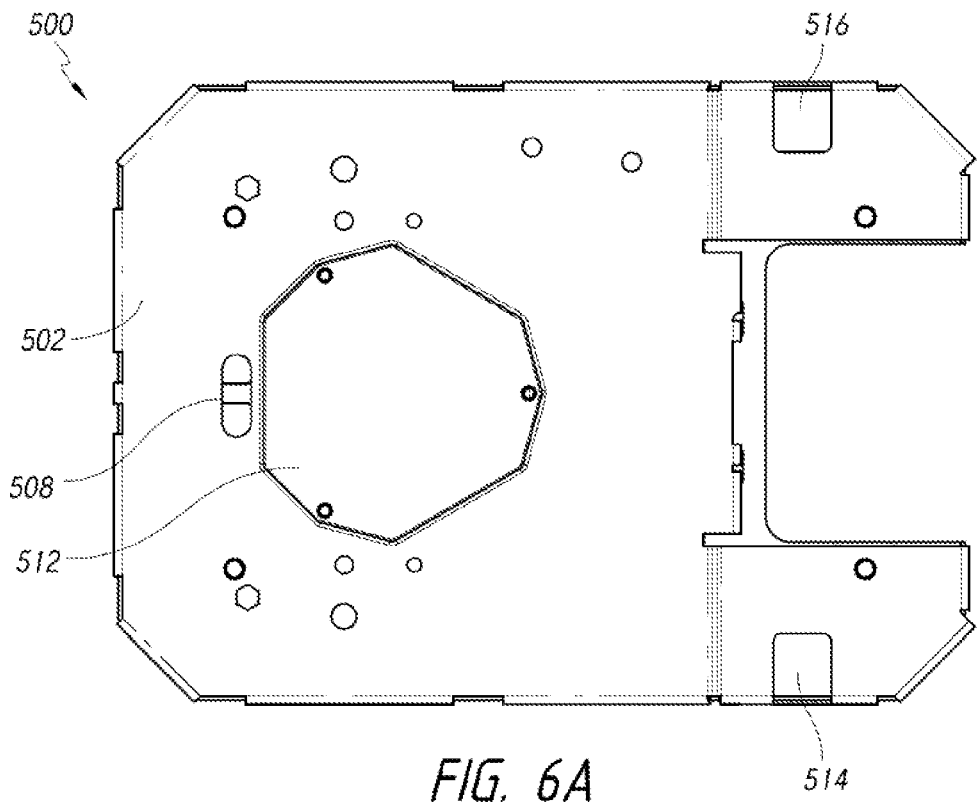
FIG. 6A is a simplified plan view of a first side of the dual purpose packaging in FIG. 5A in accordance with some implementations.
Figure 6B:
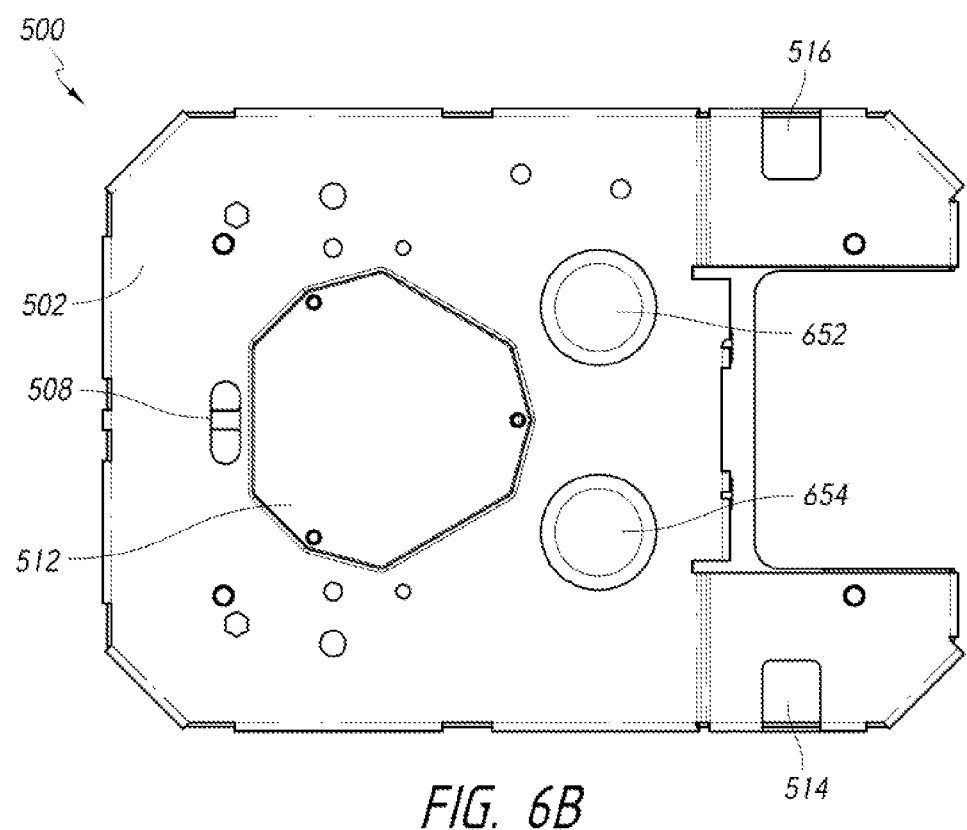
FIG. 6B is a simplified plan view of an alternative first side of the dual purpose packaging in FIG. 5A in accordance with some implementations.

As shown in FIG. 3A, the electrical components 306A, 306B, and 306C are associated with the substrate 308. The second portion 320 includes a concave depression 305 that is arranged relative to the electrical component 306A in order to draw heat away from the electrical component 306A and dissipate the heat over the first portion 310 and the second portion 320. For example, the depression 305 is arranged relative to the electrical component 306A (e.g., a process or a power supply unit) because it generates more heat than electrical components 306B and 306C. With reference to FIG. 6B, for example, the depression 305 corresponds to one of the depressions 652, 654 in the top section 502 of the dual purpose packaging 500.

As shown in FIG. 3A, the depression 305 is arranged between an optional thermal slug 302 and an optional thermal insulation material 304 which coats or is layered on the electrical component 306A. For example, the thermal slug 302 increases the thermal mass of the dual purpose packaging 300 in order to more quickly draw heat away from the electrical component 306A, which, in turn, is dissipated the over the first portion 310 and the second portion 320.

FIG. 3B is a side view of another example dual purpose packaging 350 in accordance with some implementations. In FIG. 3B, the components of the dual purpose packaging 350 are similar to and adapted from those discussed above with reference to the dual purpose packaging 300 in FIG. 3A. Elements common to FIGS. 3A and 3B include common reference numbers, and only the differences between FIGS. 3A and 3B are described herein for the sake of brevity. As shown in FIG. 3B, the optional thermal slug 302 is arranged between the depression 305 and the optional thermal insulation material 304 which coats or is layered on the electrical component 306A.

Figure 3C:
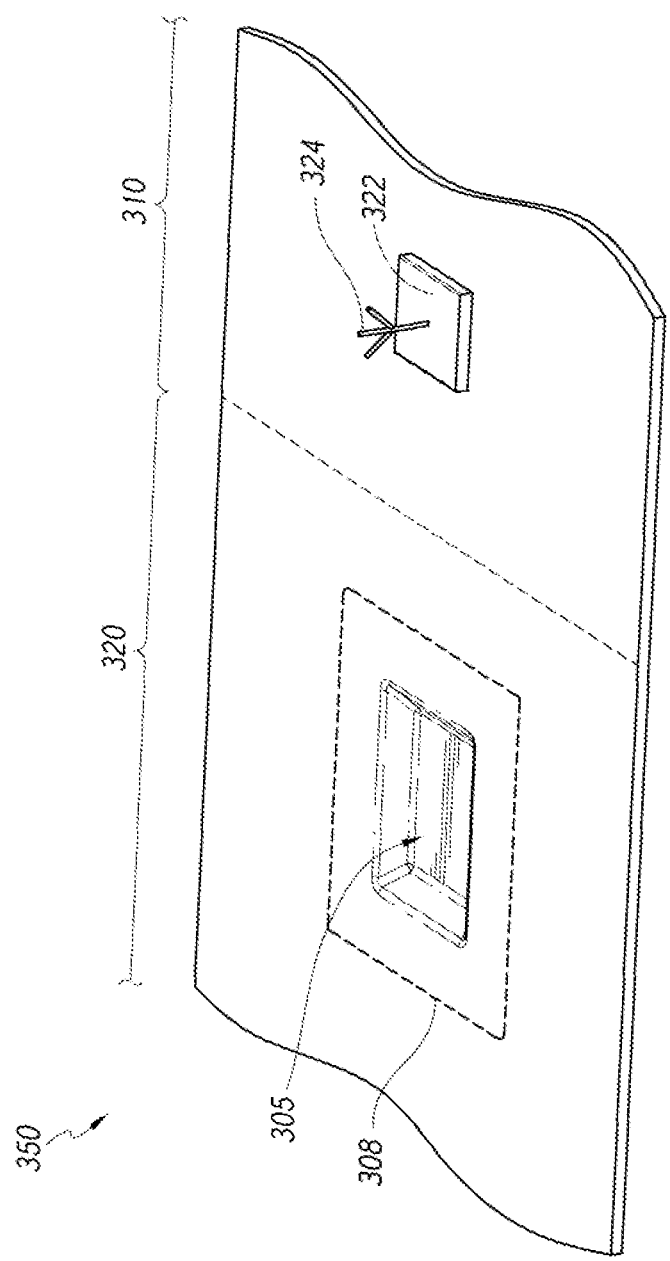
FIG. 3C is a perspective view of the dual purpose packaging in FIG. 3B in accordance with some implementations.

FIG. 3C is a perspective view of the dual purpose packaging 350 in FIG. 3B in accordance with some implementations. As shown in FIG. 3C, the surface area of the substrate 308, which is located below the depression 305 included in the second portion 320, is illustrated relative to the surface area of the dual purpose packaging 350. In some implementations, the surface area of the first portion 310 is at least 1.5 times the size of a planar surface area projection of the antenna 324. As such, the first portion 310, which functions as a reflector for the antenna 324, has a larger surface area than a conventional reflector for a PCB mounted antenna, which typically has a surface area that is the size of the footprint of the antenna (e.g., the same size as the planar surface area projection of the antenna). In some implementations, the surface area of the first portion 310 is at least 1.5 times the size of a surface area of the antenna mount 322. In some implementations, the combined surface area of the first portion 310 and the second portion 320 is at least 1.5 times the surface area of the substrate 308 (shown with dotted lines in FIG. 3C).

Figure 4A:
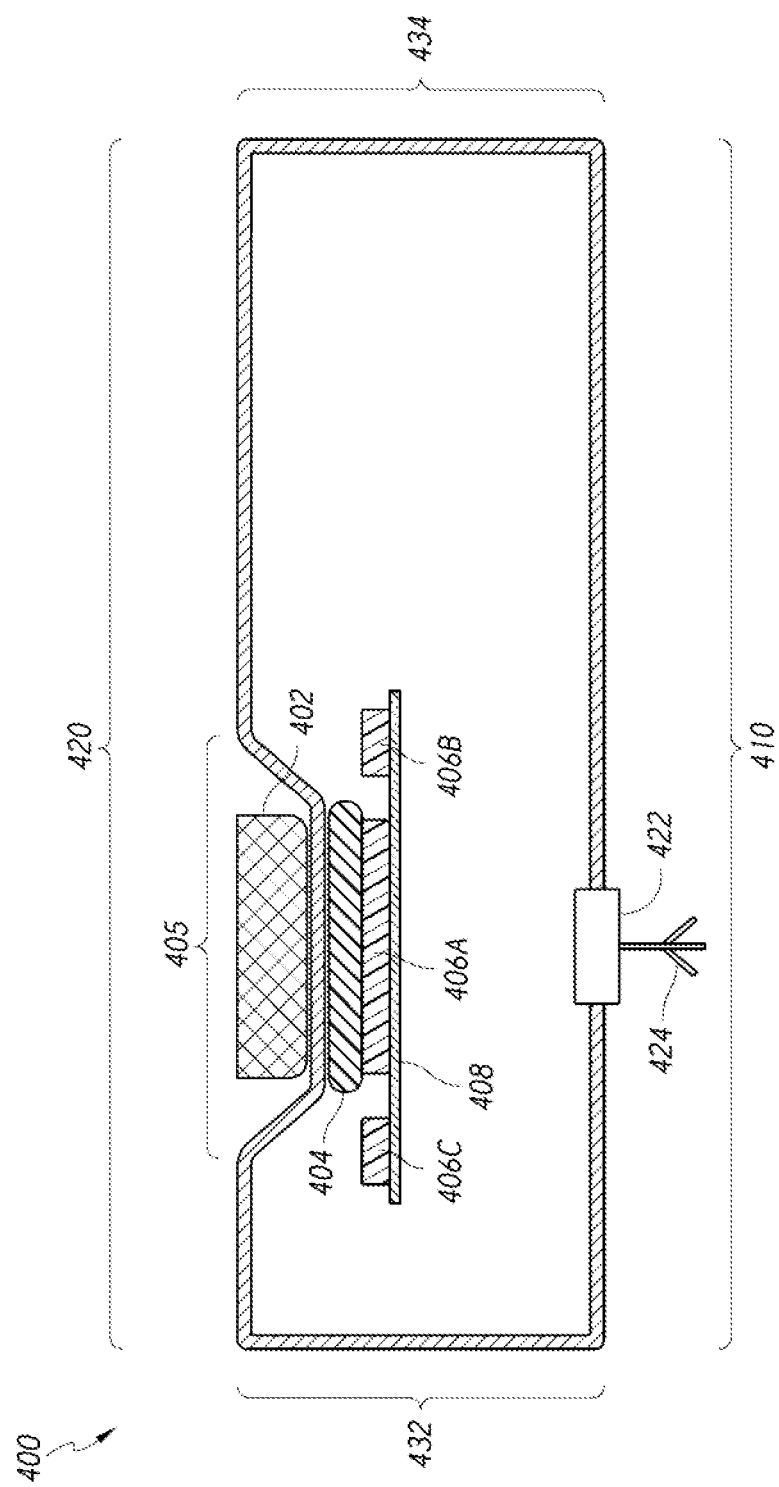
FIG. 4A is a side view of an example dual purpose packaging in accordance with some implementations.

FIG. 4A is a side view of an example dual purpose packaging 400 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, as a non-limiting example, the dual purpose packaging 400 for a networking device includes a first portion 410 having an antenna mount 422 provided for an antenna 424 and a second portion 420.

In some implementations, the first portion 410 is configured to reflect EM radiation associated with the antenna 424. In some implementations, the second portion 420 is shaped or positioned for arrangement in association with the placement of one or more electrical components on the substrate 408 in order to draw heat away from at least one of the one or more electrical components and dissipate the heat over a combined surface area of the dual purpose packaging 400 (e.g., the first portion 410 and the second portion 420). In some implementations, one or more conductive materials comprise the first portion 410 such as a metallic composite, aluminum, steel, copper, or the like. In some implementations, one or more conductive materials comprise the second portion 420 such as a metallic composite, aluminum, steel, copper, or the like. In some implementations, the first portion 410 is electrically coupled with the second portion 420 as shown in FIG. 4A. As such, the dual purpose packaging 400 functions as an electrically conductive heat coupler/dissipater and also an EM radiation reflector.

As shown in FIG. 4A, the first portion 410 is adjacent to a first side of the substrate 408, and the second portion 420 is adjacent to a second side of the substrate 408. The first portion 410 and the second portion 420 are electrically coupled via side portions 432 and 434. In some implementations, the side portions 432 and 434 are separate clips or fastening mechanisms for coupling the first portion 410 and the second portion 420. In some implementations, the side portions 432 and 434 are built into at least one of the first portion 410 and the second portion 420. For example, the first portion 410 and the second portion 420 are detachably coupled or fastened via side portions 432 and 434. In another example, first portion 410 and the second portion 420 are permanently fused or welded together via side portions 432 and 434. With reference to FIGS. 7A-7B and 8A-8B, for example, the side portions 432 and 434 correspond to one or more of clips 710, 712, 714, 716, 718, 760, 762, 764, 766, 768, 802, 804, 852, and 854.

In some implementations, for example, the first portion 410 and the second portion 420 of the dual purpose packaging 400 correspond to first and second sections of a clamshell structure that encloses the substrate 408. With reference to FIG. 5A, for example, the first portion 410, which is adjacent to a first side of the substrate 408, corresponds to the top section 502, and the second portion 420, which is adjacent to a second side of the substrate 408, corresponds to the bottom section 504.

Figure 6C:
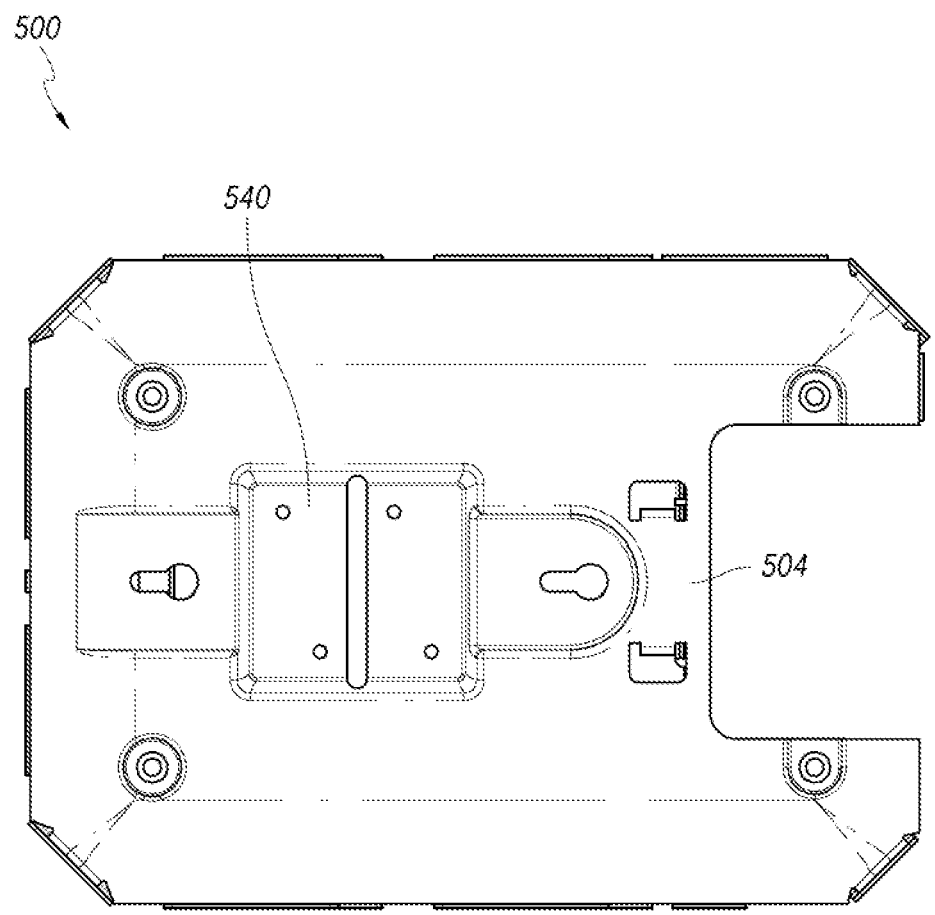
FIG. 6C is a plan view of a second side of the dual purpose packaging in FIG. 5A in accordance with some implementations.

As shown in FIG. 4A, the electrical components 406A, 406B, and 406C are associated with the substrate 408. The second portion 420 includes a concave depression 405 that is arranged relative to the electrical component 406A in order to draw heat away from the electrical component 406A and dissipate the heat over the first portion 410 and the second portion 420, which are electrically coupled via side portions 432 and 434. For example, the depression 405 is arranged relative to the electrical component 406A (e.g., a processor or a power supply unit) because it generates more heat than electrical components 406B and 406C. With reference to FIGS. 6A and 6C, for example, the depression 405 corresponds to the depression 540 in the bottom section 504 of the dual purpose packaging 500.

As shown in FIG. 4A, the depression 405 is arranged between an optional thermal slug 402 and an optional thermal insulation material 404 which coats or is layered on the electrical component 406A. For example, the thermal slug 402 increases the thermal mass of the dual purpose packaging 400 in order to more quickly draw heat away from the electrical component 406A, which, in turn, is dissipated the over the first portion 410 and the second portion 420.

Figure 4B:
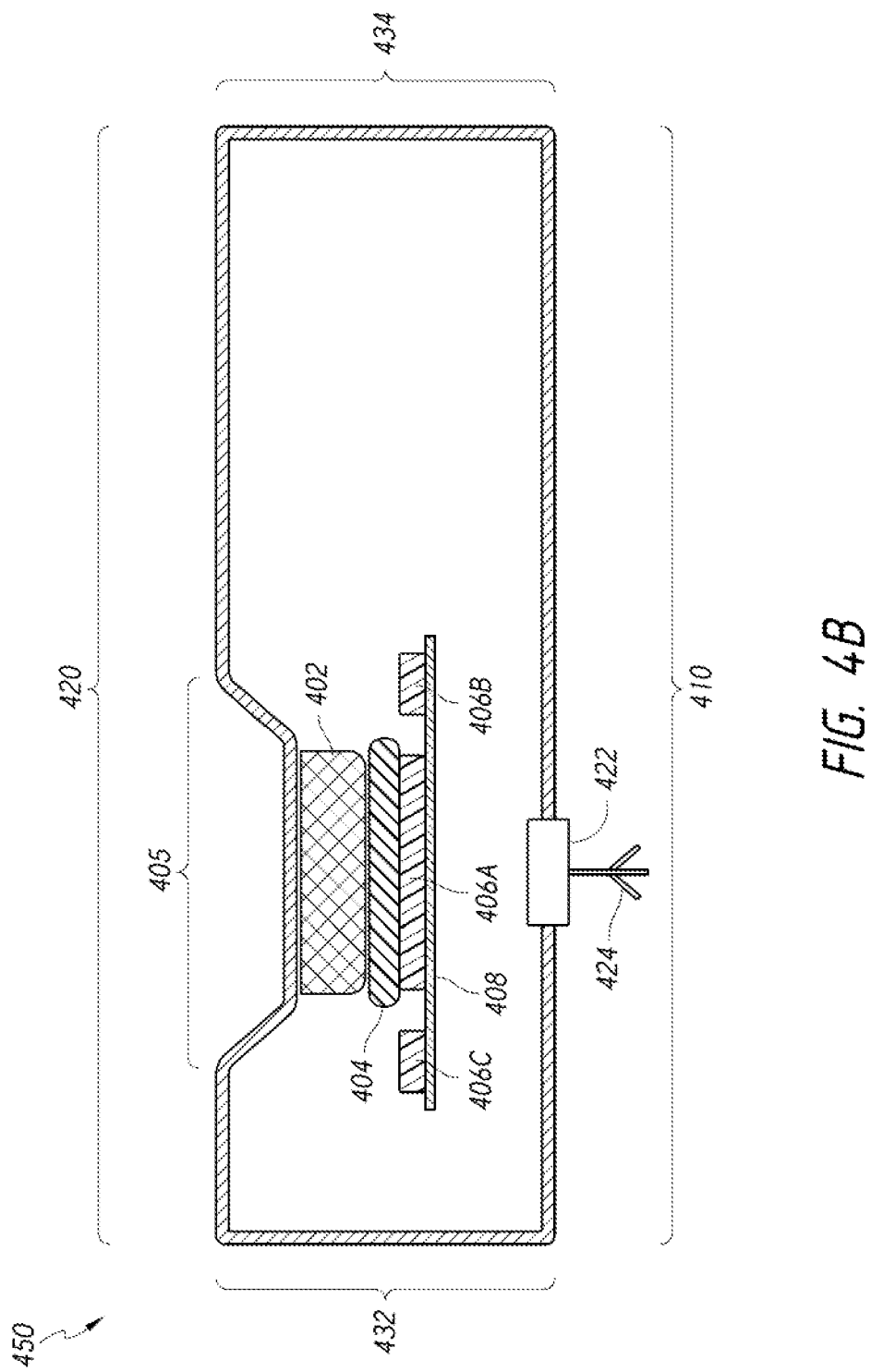
FIG. 4B is a side view of another example dual purpose packaging in accordance with some implementations.

FIG. 4B is a side view of another example dual purpose packaging 450 in accordance with some implementations. In FIG. 4B, the components of the dual purpose packaging 450 are similar to and adapted from those discussed above with reference to the dual purpose packaging 400 in FIG. 4A. Elements common to FIGS. 4A and 4B include common reference numbers, and only the differences between FIGS. 4A and 4B are described herein for the sake of brevity. As shown in FIG. 4B, the optional thermal slug 402 is arranged between the depression 405 and the optional thermal insulation material 404 which coats or is layered on the electrical component 406A.

FIG. 5A is an exploded view of an example dual purpose packaging 500 in accordance with some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, as a non-limiting example, the dual purpose packaging 500 for a networking device includes: a top section 502 having antenna mounts 512, 514, and 516 provided for antennae 510, 520, and 530, respectively; and a bottom section 504.

As shown in FIG. 5A, the top section 502 and the bottom section 504 form a clamshell structure that encloses a substrate 515. According to various implementations, the bottom section 504 includes a depression 540 which is configured for arrangement relative to at least one of the electrical components associated with the substrate 515. For example, the one or more electrical components include one or more processing units (CPU's), volatile memory (e.g., RAM), non-volatile memory (e.g., NAND or NOR), media access controller (MAC), physical transceiver (PHY), radios, power amplifiers (PAs), low noise amplifiers (LNAs), front-end modules (FEMs), diplexers, filters, light-emitting diodes (LEDs), connectors (e.g., RF or RJ45).

According to some implementations, the depression 540 included in the bottom section 504 is arranged to conduct heat away from at least one electrical component associated with the substrate 515 and dissipate the heat over the combined surface area of the dual purpose packaging 500 (i.e., both the top section 502 and the bottom section 504). In some implementations, the top section 502 is configured to reflect electromagnetic (EM) radiation associated with at least one antenna mounted thereon. In some implementations, the dual purpose packaging 500 is enclosed by a housing such as a plastic, polyvinyl chloride (PVC), etc. shell.

In some implementations, the antenna 510 is coupled to an electrical component (e.g., a modulator/demodulator component, an A/D or D/A component, a signal driver, and/or the like) associated with the substrate 515 via a cable 505 that extends through a hole 508 in the top section 502 of the apparatus 500. In some implementations, the antennae 520 and 530 are also coupled (not shown) to electrical components associated with the substrate 510. Those of ordinary skill in the art will appreciate from the present disclosure that the dual purpose packaging 500 illustrated in FIG. 5A may be configured for mounting and receiving an arbitrary number of antennae according to various other implementations.

Figure 5B:
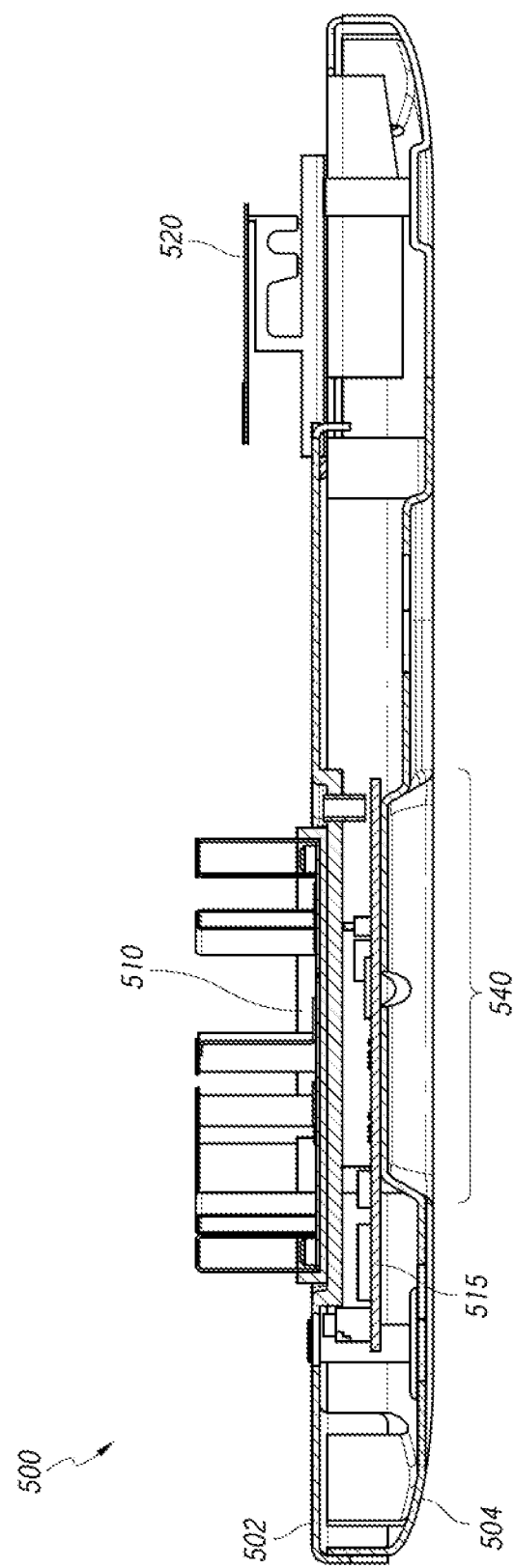
FIG. 5B is a sectional view taken along a longitudinal axis of the dual purpose packaging in FIG. 5A in accordance with some implementations.

FIG. 5B is a sectional view taken along a longitudinal axis of the dual purpose packaging 500 in FIG. 5A in accordance with some implementations. Elements common to FIGS. 5A and 5B include common reference numbers. As shown in FIG. 5B, the depression 540 included in the bottom section 504 is arranged relative to at least one of the electrical components associated with the substrate 515.

FIG. 6A is a simplified plan view of a first side of the dual purpose packaging 500 in FIG. 5A in accordance with some implementations. Elements common to FIGS. 5A and 6A include common reference numbers. FIG. 6A shows a simplified plan view of the top section 502 where antennae 510, 520, and 530 are omitted. As shown in FIG. 6A, the top section 502 includes the hole 508 for the cable 505 in FIG. 5A which couples the antenna 510 with at least one electrical component associated with the substrate 515 in FIG. 5A. The top section 502 also includes: the antenna mount 512 arranged for mounting and/or receiving antenna 510 in FIG. 5A; the antenna mount 514 arranged for mounting and/or receiving antenna 520 in FIG. 5A; and the antenna mount 516 arranged for mounting and/or receiving antenna 530 in FIG. 5A.

FIG. 6B is a simplified plan view of an alternative first side of the dual purpose packaging 500 in FIG. 5A in accordance with some implementations. The alternative first side of the dual purpose packaging 500 shown in FIG. 6B is similar to and adapted from the first side of the dual purpose packaging 500 in FIG. 6A. Elements common to FIGS. 6A and 6B include common reference numbers, and only the differences between FIGS. 6A and 6B are described herein for the sake of brevity. FIG. 6A shows a simplified plan view of an alternative top section 502 where antennae 510, 520, and 530 are omitted.

In some implementations, the top section 502 of the dual purpose packaging 500 includes depressions 652 and 654. In some implementations, the depressions 652 and 654 are positioned relative to one or more electrical components associated with the substrate 515 in FIG. 5A in order to draw heat away from the one or more electrical components and dissipate heat over the surface area of the dual purpose packaging 500. For example, the depressions 652 and 654 are positioned in the top section 502 relative to the electrical components that generate the most heat (e.g., a power supply unit and/or a processor). Those of ordinary skill in the art will appreciate from the present disclosure that the depressions 652 and 654 illustrated in FIG. 6B are provided merely as examples, and that depressions with various other shapes and/or locations are suitable for various other implementations.

FIG. 6C is a plan view of a second side of the dual purpose packaging 500 in FIG. 5A in accordance with some implementations. Elements common to FIGS. 5A and 6C include common reference numbers. As shown in FIG. 6C, the bottom section 504 includes the depression 540 which is configured for arrangement relative to at least one of the electrical components associated with the substrate 515 in FIG. 5A.

Figure 7A:
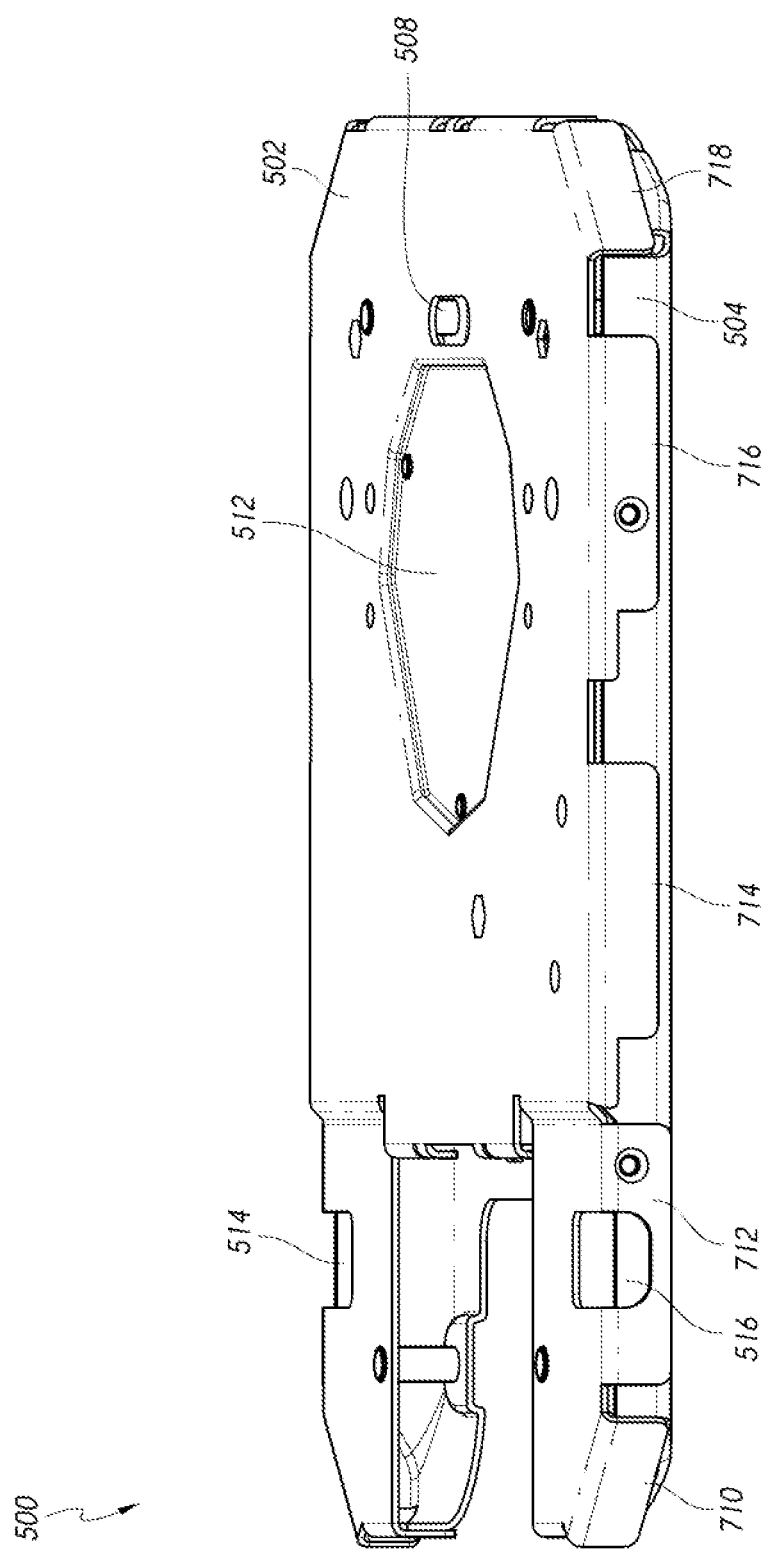
FIG. 7A is a simplified perspective view taken from a first side of the dual purpose packaging in FIG. 5A in accordance with some implementations.

FIG. 7A is a simplified perspective view taken from a first side of the dual purpose packaging 500 in FIG. 5A in accordance with some implementations. Elements common to FIGS. 5A and 7A include common reference numbers, and only previously unreferenced components are described herein for the sake of brevity. FIG. 7A shows a simplified perspective view where antennae 510, 520, and 530 are omitted from the top section 502. In some implementations, clips 710, 712, 714, 716, and 718 are configured to couple the top section 502 and the bottom section 504 of the dual purpose packaging 500. For example, the top section 502 and the bottom section 504 are detachably coupled via at least the clips 710, 712, 714, 716, and 718. In FIG. 7A, for example, the clips 710, 712, 714, 716, and 718 form at least a portion of the top section 502.

Figure 7B:
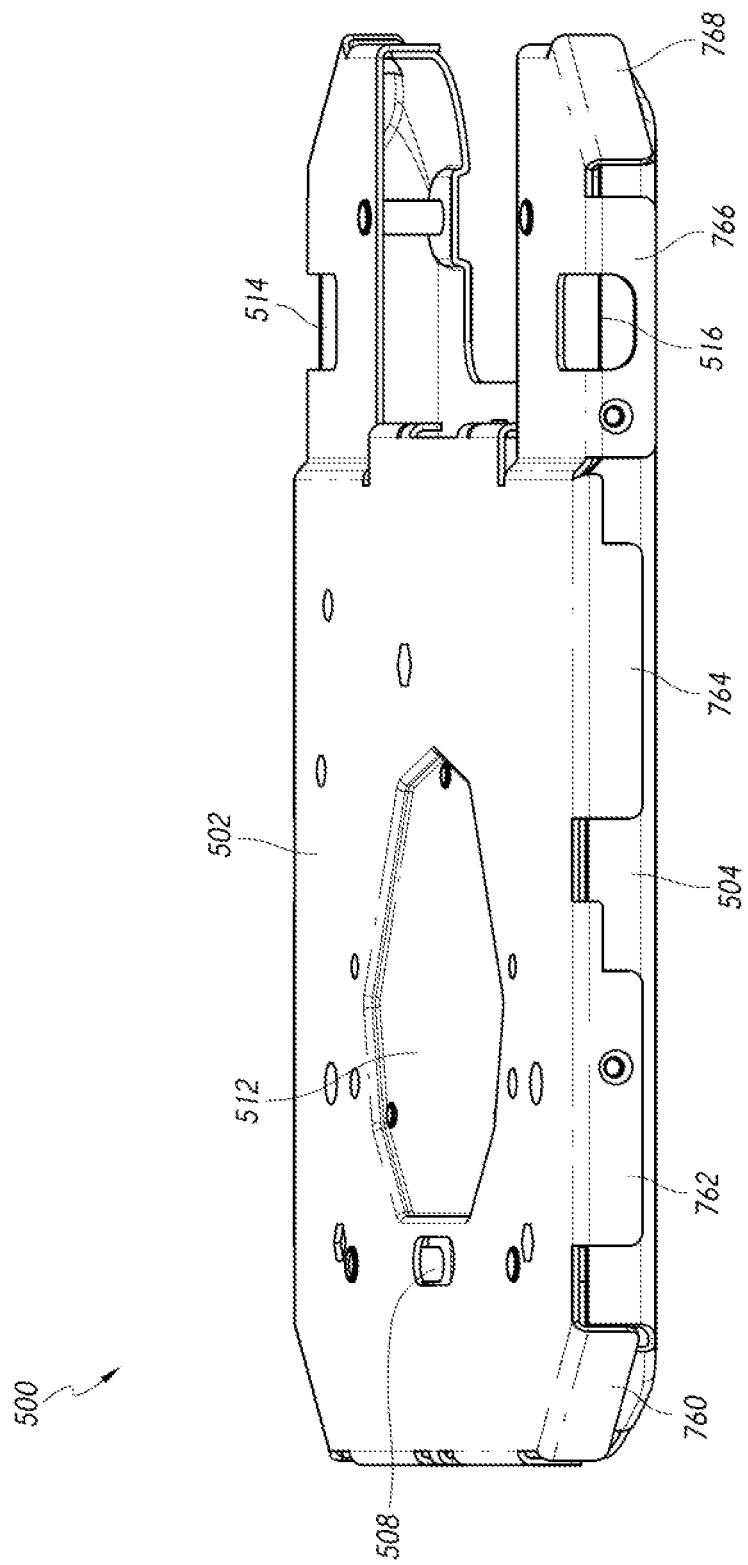
FIG. 7B is a simplified perspective view taken from a second side of the dual purpose packaging in FIG. 5A in accordance with some implementations.

FIG. 7B is a simplified perspective view taken from a second side of the dual purpose packaging 500 in FIG. 5A in accordance with some implementations. Elements common to FIGS. 5A and 7B include common reference numbers, and only previously unreferenced components are described herein for the sake of brevity. FIG. 7B shows a simplified perspective view where antennae 510, 520, and 530 are omitted from the top section 502. In some implementations, clips 760, 762, 764, 766, and 768 are configured to couple the top section 502 and the bottom section 504 of the dual purpose packaging 500. For example, the top section 502 and the bottom section 504 are detachably coupled via at least the clips 760, 762, 764, 766, and 768. In FIG. 7B, for example, the clips 760, 762, 764, 766, and 768 form at least a portion of the top section 502.

FIG. 8A is a simplified perspective view taken from a first end (i.e., the front end) of the dual purpose packaging 500 in FIG. 5A in accordance with some implementations. Elements common to FIGS. 5A, 7A-7B, and 8A include common reference numbers, and only previously unreferenced components are described herein for the sake of brevity. FIG. 8A shows a simplified perspective view where antennae 510, 520, and 530 are omitted from the top section 502. In some implementations, the apparatus 800 includes a top section 402 and a bottom section 404. In some implementations, clips 768, 802, 804, and 710 are configured to couple the top section 502 and the bottom section 504 of the dual purpose packaging 500. In FIG. 8A, for example, the clips 768, 802, 804, and 710 form at least a portion of the top section 502.

FIG. 8B is a simplified perspective view taken from a second end (i.e., the back end) of the dual purpose packaging 500 in FIG. 5A in accordance with some implementations. Elements common to FIGS. 5A, 7A-7B, and 8B include common reference numbers, and only previously unreferenced components are described herein for the sake of brevity. FIG. 8B shows a simplified perspective view where antennae 510, 520, and 530 are omitted from the top section 502. In some implementations, clips 718, 852, 854, and 760 are configured to couple the top section 502 and the bottom section 504 of the dual purpose packaging. In FIG. 8B, for example, the clips 718, 852, 854, and 760 form at least a portion of the top section 502.

Figure 9:
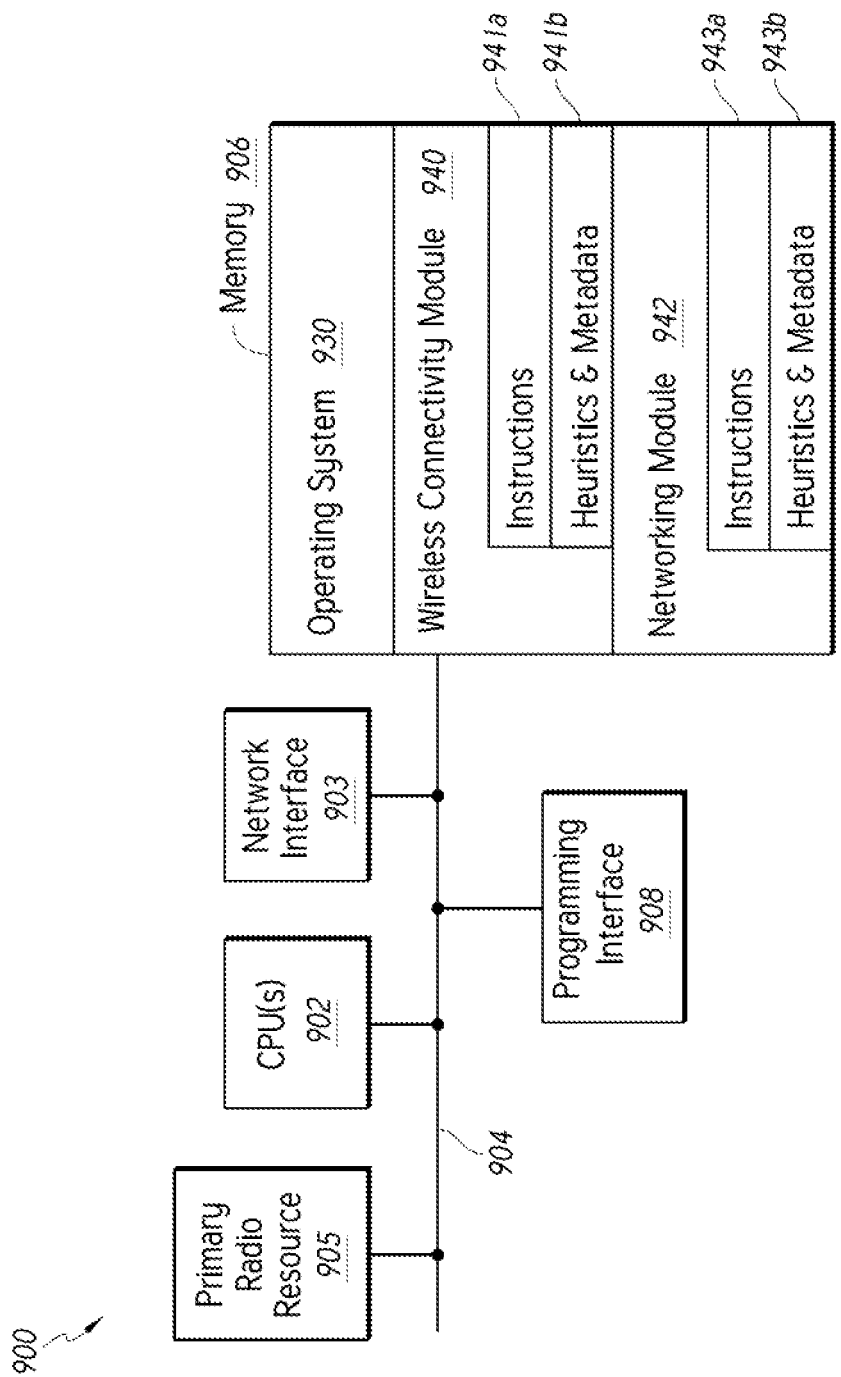
FIG. 9 is a block diagram of a device in accordance with some implementations.

FIG. 9 is a block diagram of a device 900 in accordance with some implementations. For example, in some implementations, the device 900 is a representation of the networking device 110 in FIGS. 1-2. While certain specific features are illustrated, those skilled in the art will appreciate from the present disclosure that various other features have not been illustrated for the sake of brevity, and so as not to obscure more pertinent aspects of the implementations disclosed herein. To that end, as a non-limiting example, in some implementations the device 900 includes one or more processing units (CPU's) 902 (e.g., processors), a network interfaces 903, a memory 906, a programming interface 908, a primary radio resource 905, and one or more communication buses 904 for interconnecting these and various other components.

In some implementations, the one or more communication buses 904 include circuitry that interconnects and controls communications between system components. The memory 906 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. The memory 906 optionally includes one or more storage devices remotely located from the CPU(s) 902. The memory 906 comprises a non-transitory computer readable storage medium. Moreover, in some implementations, the memory 906 or the non-transitory computer readable storage medium of the memory 906 stores the following non-exclusive programs, modules and data structures, or a subset thereof including an operating system 930, a wireless connectivity module 940, and a networking module 942. In some embodiment, one or more instructions are included in a combination of logic and non-transitory memory.

In some implementations, the primary radio resource 905 is provided to support and facilitate traffic bearing communications between the device 900 and one or more client devices (e.g., the devices 120-1, . . . , 120-N shown in FIG. 1). In some implementations, the primary radio resource 905 includes first and second radio transceivers. For example, the first radio transceiver operates according to IEEE 802.11n or IEEE 802.11ac, and the second radio transceiver operates according to BLUETOOH. In some implementations, the primary radio resource 905 includes one radio transceiver. In some implementations, the device 900 includes an optional secondary radio resource configured to scan available channels in order to identify neighboring wireless APs, and includes at least one radio receiver— which may be a third radio in various implementations.

In some implementations, the operating system 930 includes procedures for handling various basic system services and for performing hardware dependent tasks.

In some implementations, the wireless connectivity module 940 is configured to provide wireless connectivity to a number of client devices (e.g., the devices 120-1, ..., 120-N in FIG. 1) using the primary radio resource 905 operating according to any of a number of various wireless networking protocols such as IEEE 802.11b, IEEE, 802.11g, IEEE 802.11n, IEEE 802.11ac, or the like. To that end, the wireless connectivity module 940 includes a set of instructions 941a and heuristics and metadata 941b.

In some implementations, the networking module 942 is configured to route information between a network (e.g., the network 105 in FIG. 1) and the number of client devices (e.g., the devices 120-1, ..., 120-N in FIG. 1). To that end, the networking module 940 includes a set of instructions 943a and heuristics and metadata 943b.

Although the wireless connectivity module 940 and the networking module 942 are illustrated as residing on a single device 900, it should be understood that in other implementations, any combination of the wireless connectivity module 940 and the networking module 942 may reside in separate devices. For example, each of the wireless connectivity module 940 and the networking module 942 may reside on a separate device.

Moreover, FIG. 9 is intended more as functional description of the various features which may be present in a particular embodiment as opposed to a structural schematic of the implementations described herein. As recognized by those of ordinary skill in the art, items shown separately could be combined and some items could be separated. For example, some functional modules shown separately in FIG. 9 could be implemented in a single module and the various functions of single functional blocks could be implemented by one or more functional blocks in various implementations. The actual number of modules and the division of particular functions and how features are allocated among them will vary from one embodiment to another, and may depend in part on the particular combination of hardware, software and/or firmware chosen for a particular embodiment.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first portion could be termed a second portion, and, similarly, a second portion could be termed a first portion, which changing the meaning of the description, so long as all occurrences of the "first portion" are renamed consistently and all occurrences of the "second portion" are renamed consistently. The first portion and the second portion are both portions, but they are not the same portion.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. An apparatus comprising:
   an antenna mount provided for an antenna;
   a first portion of an electrically conductive heat coupler provided for the antenna mount, wherein the first portion of the electrically conductive heat coupler reflects electromagnetic (EM) radiation associated with the antenna; and
   a second portion of the electrically conductive heat coupler electrically coupled with the first portion of the electrically conductive heat coupler, wherein the second portion is shaped for arrangement in association with placement of one or more electrical components on a substrate in order to draw heat away from at least one of the one or more electrical components and dissipate the heat over a combined surface area of the first and second portions of the electrically conductive heat coupler.

2. The apparatus of claim 1, wherein the first and second portions of the electrically conductive heat coupler are substantially co-planar.

3. The apparatus of claim 1, wherein:
   the first portion of the electrically conductive heat coupler is adjacent to a first side of the substrate; and
   the second portion of the electrically conductive heat coupler is adjacent to a second side of the substrate distinct from the first side of the substrate.

4. The apparatus of claim 1, wherein a surface area of the first portion of the electrically conductive heat coupler is at least 1.5 times the size of a planar surface area projection of the antenna.

5. The apparatus of claim 1, wherein a surface area of the first portion of the electrically conductive heat coupler is at least 1.5 times the size of a surface area of the antenna mount.

6. The apparatus of claim 1, wherein the combined surface area of the first and second portions of the electrically conductive heat coupler is at least 1.5 times the surface area of the substrate.

7. The apparatus of claim 1, wherein the second portion of the electrically conductive heat coupler reflects EM radiation associated with the antenna.

8. The apparatus of claim 1, wherein the second portion of the electrically conductive heat coupler is characterized by at least one depression, wherein the at least one depression is configured to draw heat away from a respective electrical component of the one or more electrical components on the substrate.

9. A device comprising:
a substrate having one or more electrical components; and
an electrically conductive heat coupler, including:
an antenna mount provided for an antenna;
a first portion of an electrically conductive heat coupler provided for the one or more antenna mounts, wherein the first portion of the electrically conductive heat coupler reflects electromagnetic (EM) radiation associated with the antenna; and
a second portion of the electrically conductive heat coupler electrically coupled with the first portion of the electrically conductive heat coupler, wherein the second portion of the electrically conductive heat coupler is configured for arrangement in association with placement of the one or more electrical components on the substrate in order to draw heat away from at least one of the one or more electrical components and dissipate the heat over a combined surface area of the first and second portions of the electrically conductive heat coupler.

10. The device of claim 9, wherein the first and second portions of the electrically conductive heat coupler are substantially co-planar.

11. The device of claim 9, wherein:
the first portion of the electrically conductive heat coupler is adjacent to a first side of the substrate, and
the second portion of the electrically conductive heat coupler is adjacent to a second side of the substrate distinct from the first side of the substrate.

12. The device of claim 11, further comprising:
one or more clips provided for coupling the first and second portions of the electrically conductive heat coupler.

13. The device of claim 12, wherein each of the one or more clips form a section of at least one of the first portion of the electrically conductive heat coupler and second portion of the electrically conductive heat coupler.

14. The device of claim 9, wherein the second portion of the electrically conductive heat coupler is characterized by at least one depression, wherein the at least one depression is configured to draw heat away from a respective electrical component of the one or more electrical components on the substrate.

15. The device of claim 14, further comprising:
a thermal slug located between the at least one depression and the respective electrical component.

16. The device of claim 14, further comprising:
a thermal slug, wherein the at least one depression is located between the thermal slug and the respective electrical component.

17. The device of claim 14, further comprising:
a thermal insulation material located between the at least one depression and the respective electrical component.

18. A system comprising:
at least one antenna;
a substrate having one or more electrical components; and
an electrically conductive heat coupler, including:
an antenna mount provided for the at least one antenna;
a first portion of an electrically conductive heat coupler provided for the one or more antenna mounts, wherein the first portion of the electrically conductive heat coupler reflects electromagnetic (EM) radiation associated with the at least one antenna; and
a second portion of the electrically conductive heat coupler electrically coupled with the first portion of the electrically conductive heat coupler, wherein the second portion of the electrically conductive heat coupler is configured for arrangement in association with placement of the one or more electrical components on the substrate in order to draw heat away from at least one of the one or more electrical components and dissipate the heat over a combined surface area of the first and second portions of the electrically conductive heat coupler.

19. The system of claim 18, wherein the first and second portions of the electrically conductive heat coupler are substantially co-planar.

20. The system of claim 18, wherein:
the first portion of the electrically conductive heat coupler is adjacent to a first side of the substrate, and
the second portion of the electrically conductive heat coupler is adjacent to a second side of the substrate distinct from the first side of the substrate.

* * * * *